(12) United States Patent
Gottlieb et al.

(10) Patent No.: US 6,732,590 B1
(45) Date of Patent: May 11, 2004

(54) PRESSURE SENSOR AND PROCESS FOR PRODUCING THE PRESSURE SENSOR

(75) Inventors: Alfred Gottlieb, Nittendorf (DE); Martin Schröder, Donaustauf (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/301,096

(22) Filed: Nov. 20, 2002

(51) Int. Cl.[7] .................................................. G01L 9/16
(52) U.S. Cl. .............................. 73/754; 73/754; 73/756
(58) Field of Search .................................. 73/700–756

(56) References Cited

U.S. PATENT DOCUMENTS

| | | | | |
|---|---|---|---|---|
| 4,043,027 A | * | 8/1977 | Birchler et al. ............. 438/112 |
| 4,467,522 A | * | 8/1984 | Marchisi ...................... 29/827 |
| 5,224,261 A | * | 7/1993 | Morrill, Jr. .................. 29/623 |
| 5,365,655 A | * | 11/1994 | Rose ........................... 29/827 |
| 6,228,181 B1 | * | 5/2001 | Yamamoto et al. ........ 148/33.5 |

* cited by examiner

*Primary Examiner*—Edward Lefkowitz
*Assistant Examiner*—Jermaine Jenkins
(74) *Attorney, Agent, or Firm*—Laurence A. Greenberg; Werner H. Stemer; Gregory L. Mayback

(57) ABSTRACT

The invention relates to a pressure sensor with an MEM structure (micro electro mechanical structure), which has a hollow housing in which a semiconductor chip with a pressure-sensitive area is arranged. In its interior and with parts of the semiconductor chip, the housing is covered by a first plastic compound, which has a lower level of deformation than a second plastic compound, which partly covers the pressure-sensitive area of the semiconductor chip.

16 Claims, 3 Drawing Sheets

PRESSURE SENSOR AND PROCESS FOR PRODUCING THE PRESSURE SENSOR

BACKGROUND OF THE INVENTION

FIELD OF THE INVENTION

The invention relates to a pressure sensor which is subjected to an external pressure, having a semiconductor chip which has a pressure-sensitive area, and a process for producing such a pressure sensor.

Such pressure sensors constructed on the basis of semiconductor materials and using what is known as the MEM technique or microelectromechanical technique are used for automotive applications, such as motor vehicle tires, and exhibit a high failure rate with increased requirements in relation to increased attack of aggressive media and increased accelerative loadings.

SUMMARY OF THE INVENTION

It is an object of the invention to provide a pressure sensor which withstands the increased requirements in relation to environmental influences, to accelerative and external pressure loadings and attacks of aggressive media.

According to the invention, the pressure sensor has a semiconductor chip having a pressure-sensitive area which is subjected to an external pressure, and contact areas which are arranged on a pressure-insensitive area of the semiconductor chip. The semiconductor chip is arranged in a hollow housing which has a housing base on which the semiconductor chip is adhesively bonded. The hollow housing additionally has a housing wall which surrounds the semiconductor chip and through which flat conductors project with an internal section into a housing interior. External sections of the flat conductors project out of the housing wall. Arranged between the contact areas of the semiconductor chip and the internal sections of the flat conductors are connecting elements which connect predetermined contact areas electrically to corresponding internal sections.

The connecting elements, the internal sections and the contact areas within the surrounding housing wall are covered by a first plastic compound. The pressure-sensitive area of the semiconductor chip is at least partly covered by a second plastic compound. Because of its material characteristics, under the same external pressure loading, the first plastic compound is subjected to lower deformations than the second plastic compound.

This pressure sensor according to the invention has the advantage that, as a result of extensive covering of the pressure-insensitive areas within the housing of a first plastic compound with a negligible deformation, the deformation loadings at increased external pressure are reduced, in particular for deformation-sensitive components such as the connecting elements. As a result of limiting the highly deforming second plastic compound to a pressure-sensitive area of the sensor, the remaining areas and components within the housing are protected against distortions and displacements as a result of tensile, compressive and shear stresses during deformation of the pressure-sensitive area.

The pressure sensor according to the invention is able to satisfy the increased requirements on temperature-cycle resistance and pressure resistance and erosion resistance with respect to aggressive media without failing. A pressure sensor protected in this way by two different plastic components can advantageously be used for continuous operational monitoring of the tire pressure in rotating vehicle tires up to a tire pressure of 100 MPa without it being possible to determine large temperature hysteresis values in the operating temperature range between −50° C. and +150° C. The scatter in the temperature response is likewise reduced as compared with pressure sensors merely having a silicone gel covering on all sides.

The first plastic compound preferably has a thermosetting plastic made of an epoxy resin or a silicone resin. These resins, with appropriate fillers, can exhibit a coefficient of thermal expansion which is matched to the coefficient of expansion of the semiconductor material and/or the material of the hollow housing. The hollow housing has either a ceramic substance or a plastic material. In the ceramic substance or the plastic material, a transition layer of a flat conductor is embedded in such a way that an internal section of the flat conductor projects into the interior of the hollow housing and an outer section of the flat conductor projects outward from the housing wall.

The flat conductor is anchored in the hollow housing by the transition section. In order to support the internal section, the hollow housing can have a ledge on the housing inner wall, to which the internal section of the flat conductor is fitted. This ensures secure bonding of a bonding wire between a contact connection area of the internal section of the flat conductor and a bonding wire which is intended to connect the flat conductor to contact areas on the pressure-insensitive areas of the semiconductor chip.

In the event of thermal loading, in particular the flat connections between the bonding wire and the contact connecting area and the bonding wire and the contact area are endangered if, in these intrinsically pressure-insensitive areas of the pressure sensor, highly deformable plastic protective layers made of a resilient elastomer are applied. It is therefore advantageous to protect these areas not serving as sensors against thermal stresses and severe deformations of a covering plastic compound such as the second plastic compound. Furthermore, the first plastic compound adheres both to the pressure-insensitive areas of the semiconductor chip and to the inner walls of the hollow housing, so that the interfaces between the first plastic compound and semiconductor chip and also between the first plastic compound and the hollow housing are protected against aggressive media.

The second plastic compound preferably has a plastic gel of a resilient elastomer based on silicone. In this case, the high resilience permits protection of a membrane of semiconductor material arranged underneath in the pressure-sensitive area of the semiconductor chip without hysteresis effects building up. Such resilient elastomers are based on dimethyl polysiloxane or phenyl polysiloxane and can be used for operating temperatures in the range from −55° C. to +200° C. or −120° C. to +200° C., depending on the base material. A further preferred resilient elastomer is based on fluorosiloxane and can be used at operating temperatures between −55° C. and +175° C. Fluorosiloxanes of this type can be used in particular for the vehicle sector, since they are resistant with respect to fuels and solvents.

For resilient elastomers of this type, based on silicone, the energy loss factor at a predefined pressure cycle frequency, of the order of magnitude of minus four powers of ten, is extremely low, so that such a second plastic compound follows the deformations of the pressure-sensitive area of the semiconductor chip with negligible energy loss. Furthermore, elastomers based on silicone have the advantage that they can form intensive adhesion to silicone resins.

The risk of microcracks in the interface between the first plastic compound and the second plastic compound can therefore be reduced if a silicone resin is used as the first plastic compound and an elastomer based on silicone is used as the second plastic compound.

The hollow housing can have a housing cover with an opening which leaves the pressure-sensitive area and the second plastic compound free. A housing cover of this type can advantageously be matched to the inner dimensions of the housing wall, by its external:dimensions permitting a clearance fit with respect to the inner dimensions of the housing wall of the hollow housing. Following the application of the first plastic compound and still before the crosslinking of the resin, this housing cover is pressed onto said resin, at the same time any joints with respect to the housing wall being sealed off. A second plastic compound can be introduced into the opening that leaves the pressure-sensitive area of the semiconductor chip free, before or else after the fitting of the housing cover.

In order to construct the semiconductor chip as a pressure sensor, the semiconductor chip has a hermetically sealed cavity under reference pressure. This cavity can have a cylindrical shape which is surrounded by a rigid semiconductor wall of semiconductor chip material. This cylindrical shape is sealed off on one side by a pressure-sensitive membrane of semiconductor chip material. This membrane of semiconductor chip material can thus form the pressure-sensitive area of the semiconductor chip. For this purpose, the membrane of semiconductor chip material can have at least one sputtered-on electrode a few nanometers thick, via which an electrical signal, which corresponds to the flexure of the membrane under pressure loading, can be generated.

The cavity in the semiconductor chip material is sealed off hermetically with respect to the housing base by means of a gas-tight adhesive layer between the housing base and the semiconductor wall. If, for example, a tire pressure is applied to the pressure sensor, the membrane of semiconductor chip material bulges inward, so that the distance between the electrode arranged on the membrane and an electrode fitted to the housing base decreases. In this way, for example, the resonant frequency of an RC tuned circuit or an LC tuned circuit may be shifted, so that the frequency shift represents a measure of the flexure of the membrane and therefore a measure of the external pressure with respect to the reference pressure in the cavity. A pressure sensor of this type according to the invention has the advantage that, on account of the two different plastic covering compounds, it is protected against aggressive media and, secondly, on account of the resilience of the semiconductor chip material, it is able to measure large external pressure changes without being damaged and with a negligible energy or attenuation loss.

In order to be able to apply supply voltages and supply currents to the contact areas of the semiconductor chip and to be able to pick up pressure-specific electrical signals from the pressure sensor, the flat conductors have external sections projecting out of the housing wall of the hollow housing. These external sections of the flat conductors can be arranged at the level of an outer underside of the base or at the level of the inner upper side of the housing base. An arrangement at the level of the inner housing base ensures that the underside of the housing base consists entirely of hollow housing material, as a result of which the flat conductors are embedded in a better protected and better anchored manner in the housing wall of the hollow housing. The anchoring of the flat conductors with their transition sections in the housing wall can be improved further if the flat conductors do not project rectilinearly through the housing wall but if the flat conductors additionally have a Z-shaped angled section within the housing wall.

The pressure sensor according to the invention can withstand external pressure loadings such as occur in vehicle tires and, furthermore, can withstand without damage extreme accelerations such as occur during the rotation of vehicle tires. The pressure sensor according to the invention is therefore suitable to be arranged as a permanent pressure sensor in the rotating vehicle tire. Furthermore, the pressure sensor can be used in motor vehicles at all locations which, firstly, are subjected to high mechanical loadings and, secondly, are subjected to environmental influences, in particular aggressive media.

A pressure sensor can be produced by the following process steps.

First of all, a hollow housing is provided, specifically with an incorporated semiconductor chip which has a pressure-sensitive area and pressure-insensitive areas. The hollow housing also has an opening which leaves at least the pressure-sensitive area free. The housing and the semiconductor chip are already connected to one another via corresponding electric connecting elements in such a way that external sections of flat conductors have access to the electrodes of the semiconductor chip. The hollow housing with semiconductor chip and connecting elements is then covered by a first plastic compound, while sealing the surfaces of housing inner walls and also surfaces of the pressure-insensitive areas of the semiconductor chip. During this application of a first plastic compound, the pressure-sensitive area of the semiconductor chip is left substantially free. A second plastic compound is then applied to the pressure-sensitive area of the semiconductor chip, while sealing the interfaces between the first and second plastic compound in a gas-tight manner.

Owning to its material characteristics and owing to its geometrical construction, the first plastic compound differs from the second plastic compound in that, given identical external pressure conditions, lower deformations occur in the first plastic compound. This process has the advantage that a pressure sensor is formed which has a covering made of two different plastic components, which differ fundamentally in their deformation behavior. Thus, deformations which occur in the pressure-sensitive area are not transmitted to the deformation-sensitive connecting elements.

Both the application of a first plastic compound and the application of a second plastic compound can be carried out using a simple dispensing technique. On the other hand, it is possible by means of molding to apply the first plastic compound first of all, which can be made of a deformation-resistant thermosetting plastic, and then to apply the resiliently deformable second plastic compound to the pressure-sensitive areas of the semiconductor chip by means of dispensing, spinning on or varnishing on. These techniques can also be carried out in an extremely inexpensive and cost-effective manner, so that the process costs remain low.

A large number of semiconductor chips with pressure-sensitive areas, such as are required for incorporation in a hollow housing, can be produced simultaneously and in parallel in the following manner.

First of all, semiconductor chip positions are defined on a semiconductor wafer. Then, a plurality of cavities are etched in at the semiconductor chip positions from the rear side of the semiconductor wafer. This wet-chemical etching by means of alkalis or acids or dry etching by means of a reactive plasma is continued until a translucent and/or pressure-sensitive membrane remains on the upper side of the semiconductor chip, in the semiconductor chip positions.

Then, electrodes can be applied selectively to the pressure-sensitive membranes on the semiconductor wafer, that is to say on its upper side. Electrodes of this type can be structured as a capacitor plate or as a measuring strip or as a filter pattern as an electrode of a travelling wave amplifier. Contact areas, which are connected to the electrodes via conductor tracks, are then applied to the pressure-insensitive upper side of the semiconductor wafer, that is to say in the areas in which there is no membrane. In addition, passive and active semiconductor components relating to integrated circuits and evaluation structures can already be introduced into the pressure-insensitive areas of the semiconductor chip. Finally, the semiconductor wafer is divided up into individual semiconductor chips having a cavity and a pressure-sensitive membrane and also contact areas.

One advantage of this process is that, for a plurality of semiconductor chips, both the cavities for a reference pressure and also sensor electrodes, contact areas and control and evaluation circuits are produced in parallel and simultaneously on a semiconductor wafer.

In parallel with the production of suitable semiconductor chips, hollow housings with a housing base, including the embedding of transition sections of flat conductors in housing walls, can be pressure die-cast or pressure-pressed on a flat lead frame. Pressure die-casting is used when hollow plastic housings are to be produced, while pressure pressing with subsequent sintering is preferred for hollow ceramic housings. A flat lead frame of this type can have a plurality of hollow housings one behind another on a flat conductor strip and in rows beside one another at appropriate component positions.

In an automatic fitting machine, the semiconductor chips can then be bonded with their cavities onto the housing bases of the hollow housings, sealing off the cavities in a gas-tight manner. After fitting, the flat lead frame having a plurality of hollow housings, which now have the semiconductor chips, can be put into a bonding machine, in which internal sections of the flat conductors are connected electrically to contact areas of the semiconductor chip via bonding wires. A process of this type is also -suitable for the mass production of pressure sensors, so that cost-effective production becomes possible.

Finally, as mentioned above, the first plastic compound is already applied, in which the connecting elements are embedded. The uncovered pressure-sensitive area of the semiconductor chip is then covered by the second plastic compound, as mentioned above. Finally, a further housing cover can be fitted to the hollow housing, leaving the pressure-sensitive area free and leaving the second plastic compound free.

In summary, it should be recorded that a pressure sensor according to the invention with an MEM structure (micro electro mechanical structure) has a pressure-transmitting layer in the form of a gel over the MEM structure, and this pressure-transmitting layer of gel can be reduced to a surface minimum without exerting stresses on the remaining part of the semiconductor chip, if the semiconductor chip is covered in a low-stress manner by means of two different processes and two different materials. For this purpose, in a trough-like body of a hollow housing, contact is made with the semiconductor chip and, by means of these two different processes, two different materials are applied. A pressure sensor of this type with MEM structure exhibits the following advantages in the functional tests:

low-stress encapsulation with improved accuracy of the MEM output, improved adhesion between the encapsulation materials used, so that for the first time a required media compatibility for a tire pressure sensor is achieved, for the first time, fulfilment of the required mechanical acceleration tests for such a tire pressure sensor, optimization of the plastic compounds to the MEM structure of the semiconductor chip.

In essence, the invention comprises a combination of globtop around the semiconductor chip and also on the pressure-insensitive surface of the semiconductor chip, and a pressure-transmitting silicone gel in the smallest possible amount on the pressure-sensitive area of the semiconductor chip.

DESCRIPTION OF THE PREFERRED EMBODIMENTS

Figure 1:
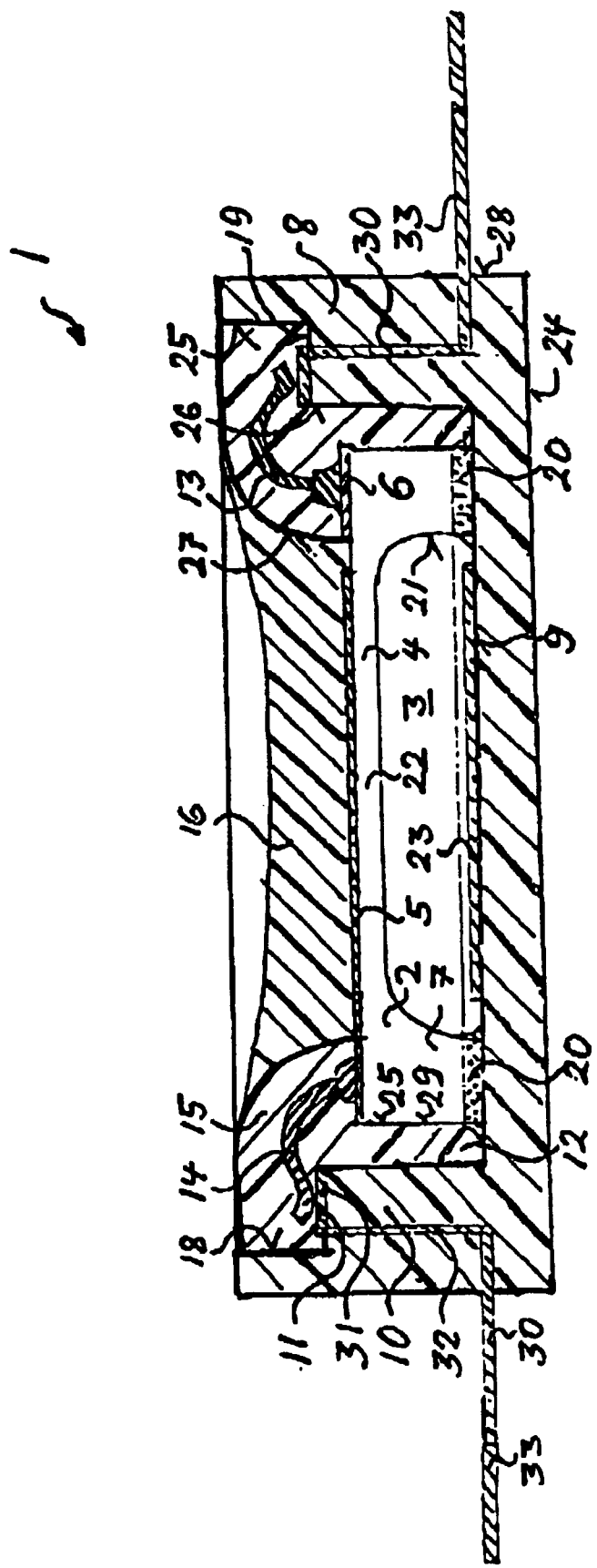
FIG. 1 shows a schematic cross section through a pressure sensor of a first embodiment of the invention.

FIG. 1 shows a schematic cross section through a pressure sensor 1 according to a first embodiment of the invention. The pressure sensor 1 has substantially two components, namely a hollow housing 8 and a semiconductor chip 2 which is arranged in the hollow housing 8. The hollow housing 8 is trough-like and has an opening 18 on the upper side to an interior 12 which is closed off at the bottom by a housing base 9. The hollow housing 8 additionally has transition sections 32 of flat conductors 30 embedded in housing walls 10. These flat conductors 30 project with external flat conductor sections 33 laterally out of the housing wall 10. The flat conductors 30 have internal sections 31 projecting into the interior 12. The internal sections 31 are arranged on a ledge 19 on the housing wall 10 and form a contact terminal area 11 which is suitable for a connecting element 14 in the form of a bonding wire 13 to be bonded on. For this purpose, the contact terminal areas 11 of the internal sections 31 are provided with a coating which can be bonded.

In this first embodiment of the invention, the hollow housing 8 is pressure die-cast from a plastic housing compound in appropriate sensor positions on a flat lead frame. During the pressure die-casting, at the same time the transition sections 32 of the flat conductors 30 are enclosed in the housing wall 10 and anchored in the latter. For the purpose of improved anchoring, the transition section 32 of the flat conductor is angled over in a Z shape. In addition, the transition area 32 has a layer which improves adhesion for the plastic housing compound.

The semiconductor chip 2 is arranged on the substantially flat housing base 9. In order to form the pressure-sensitive area 4, the semiconductor chip 2 has a cavity 3 which is etched into the semiconductor material from the rear side of the semiconductor chip 2. This etching is carried out in such a way that a transparent and pressure-sensitive membrane 22 remains in the area of the upper side of the semiconductor chip 2. This membrane 22 is coupled to an electrode 5 of a few nanometers thickness in order to produce a capacitive electromechanical coupling. The cavity 3 has a dimensionally stable, pressure-insensitive semiconductor wall 21 which bears contact areas 6 on its upper side. The semiconductor wall 21 is fixed with its underside on the housing base 9 with a hermetically sealing, gas-tight adhesive layer 20.

In this first embodiment of the invention, a further flat conductor is arranged on the housing base 9 as an electrode 23. From the contact areas 6 on the pressure-insensitive semiconductor wall 21, electric connecting elements 14 in the form of bonding wires 13 lead to the internal sections 31 of the flat conductors 30. Via these bonding wires and via the electrode 23 on the housing base 9, both supply voltages can be fed in and signal voltages can be tapped off. The interior 12 is filled with a first plastic compound 15, which simultaneously embeds the bonding wires 13 and seals off the interspace between the housing walls 26 and the semiconductor surfaces 25 in the pressure-insensitive area of the semiconductor chip 2 in a gas-tight manner.

A second plastic compound 16 of silicone based on fluoropolysiloxane forms a complete covering for the pressure-sensitive area 4 of the semiconductor chip 2. At the same time, the second plastic compound 16 seals off the boundary layer 27 to the first plastic compound 15 in a gas-tight manner. While the first plastic compound 15 is relatively rigid and dimensionally stable, the second plastic compound 16 follows the movements of the membrane 22 in the pressure-sensitive area 4 of the semiconductor chip 2. Therefore, firstly the semiconductor chip 2, in particular in the pressure-sensitive area 4, is protected against aggressive solvents and acids. Secondly, a reliable measured result from the pressure sensor 1 is provided as a result of the resilient properties of the second plastic layer 16. Owing to the better deformability with respect to the first plastic layer 15, transmission of pressure with a low energy loss is achieved. By means of the covering with two different plastic compounds 15 and 16, it is further possible for a pressure of up to 100 MPa to be measured without microcracks occurring in the interfaces between the plastic compounds 15 and 16 and the material of the hollow housing and without the temperature response of the measurement exhibiting hysteresis from −50° C. to +150° C.

The temperature resistance of this silicone gel based on fluoropolysiloxane lies between −55° C. and +175° C. Furthermore, this silicone gel has the advantage that it is resistant to fuel and solvents. The first embodiment of the invention is therefore particularly suitable for continuous checking and measurement of the tire pressure of vehicles. Furthermore, a high acceleration resistance could be determined for this pressure sensor 1, without the serviceability of the pressure sensor 1 being impaired.

In order to produce a pressure sensor 1 of this type, first of all a plurality of semiconductor chips 2 is produced on a silicone wafer, the silicone wafer being etched at semiconductor chip positions from its rear side until cavities 3 are produced and until a transparent, thin silicone membrane 4 remains from the upper side. The electrodes 5 and the contact areas 6 are also further applied to the silicone wafer. In addition, evaluation circuits are arranged in a pressure-resistant area of the semiconductor material of the silicone wafer before the silicone wafer is divided up into individual semiconductor chips 2.

In parallel with this, for this first embodiment according to FIG. 1, a flat lead frame, not shown here, is provided, to be specific having three sensor positions in a row and a plurality of sensor positions in appropriate columns. Arranged in each of the sensor positions are flat conductors angled over in a Z shape, over which a plastic housing is molded in their transition section 32. In this case, both the ledge 19 and the flat housing base 9 are constructed to hold contact terminal areas 11 of the internal sections 31 of the flat conductors 30.

The rear side of the semiconductor chip 2 is adhesively bonded in a gas-tight manner to the housing base 9, so that a hermetically sealed cavity 3 is produced when the flat lead frame is fitted with semiconductor chips 2. This hermetically sealed cavity 3 is then at a reference pressure. After the hollow housings 8 have been fitted in every pressure-sensor position of the flat lead frame, connecting elements 14 are produced between the contact terminal areas 11 and the contact areas 6, by bonding wires 14 from the contact area 6 being bonded to the contact terminal area 11. A first plastic compound 15 is then applied in a globtop process, leaving the membrane 22 free, said compound consisting of a thermosetting plastic and being cured at a temperature of 150° C. for four hours. The second plastic can then be applied in the form of a silicone gel which, as described above, is based on a fluoropolysilane and in this exemplary embodiment is cured for 30 minutes at 150° C. While the first plastic compound 15 exhibits a high dissipation factor of about $6 \times 10^{-3}$, the dissipation factor of the resilient silicone gel of the second plastic compound 16 is of the order of magnitude of $10^{-4}$.

Figure 2:
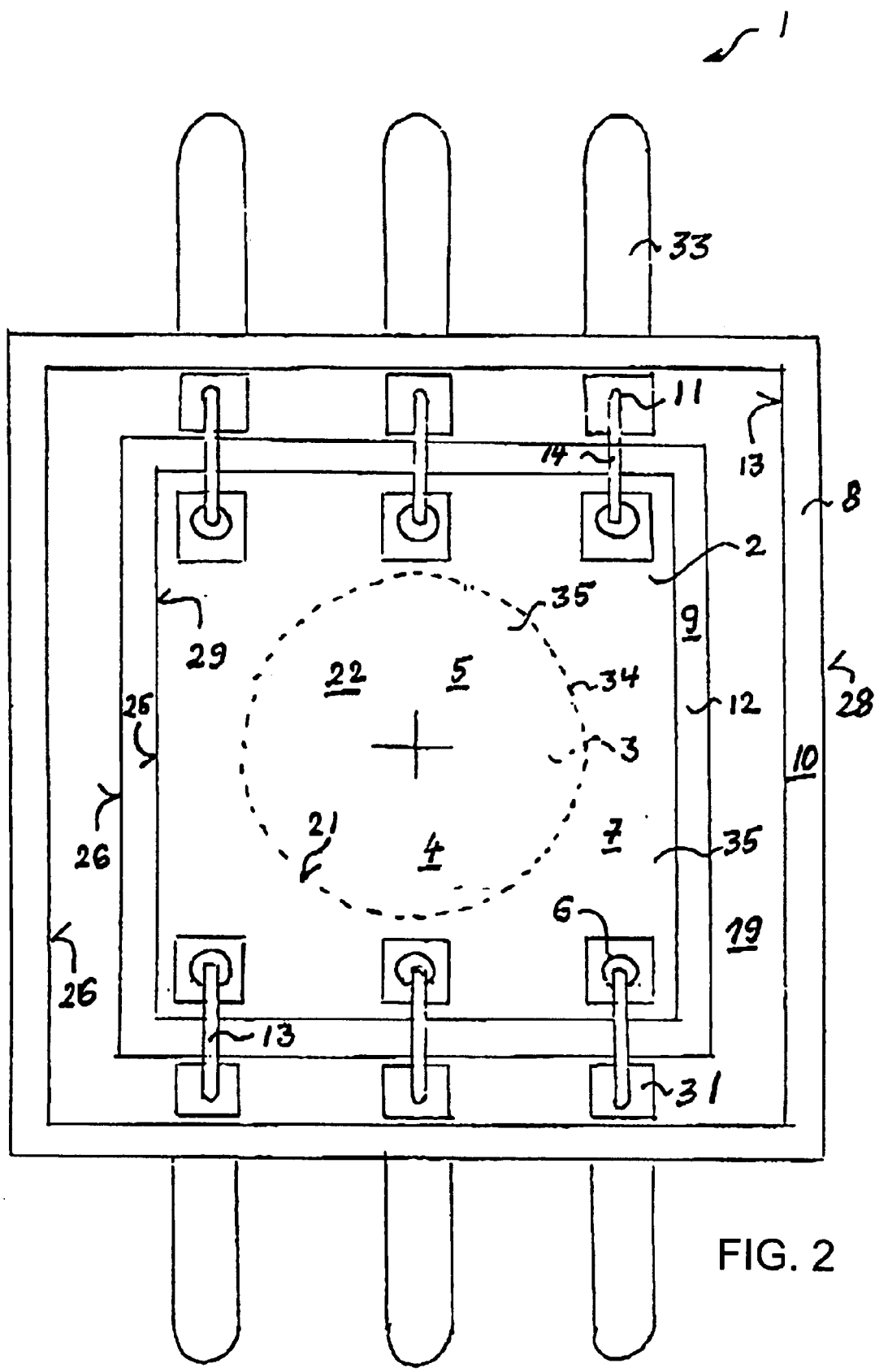
FIG. 2 shows a plan view of the pressure sensor with semiconductor chip according to FIG. 1, leaving out plastic coverings of the pressure sensor.

FIG. 2 shows a plan view of the pressure sensor 1 with semiconductor chip 2 according to FIG. 1, leaving out the plastic coverings of the first and second plastic layer 15 and 16. Components with the same functions as in FIG. 1 are identified by the same designations and not specifically explained. The same also applies to FIG. 3, which will be explained below.

FIG. 2 shows the housing 8, which is surrounded by a housing outer edge 28 and which has housing inner walls 26, a ledge 19 reducing the size of the interior 12 to hold the semiconductor chip 2. Internal sections 31 of the flat conductors 33 can be seen on the ledge 19. These internal sections 31 serve at the same time as contact terminal areas 11 for connecting elements 14 which, in this embodiment, consist of bonding wires 13. These connecting elements 14 connect the contact terminal areas 11 to contact areas 6 on the upper side 35 of the semiconductor chip 2. The upper side 35 of the semiconductor chip 2 has a pressure-insensitive area 7 and a pressure-sensitive area 4, a dashed line 34 indicating the boundary between the two areas.

The cylindrical cavity 3 arranged under the pressure-sensitive area 4 is sealed with respect to the upper side 3 by a membrane 22 of semiconductor material. This membrane 22 is covered by an electrode 5, which is connected to one of the contact areas 6 via a conductor track, not shown. The structure illustrated in FIG. 2 becomes visible as soon as the hollow housing 8 is fitted with the semiconductor chips 2 and the contact areas 6 of the semiconductor chip 2 are connected to the contact terminal areas 11 on the housing ledge 19 via bonding wires 13. Then, in order to complete the pressure sensor 1, it is merely necessary for the first plastic compound 15 shown in FIG. 1 to be applied to the pressure-insensitive areas while sealing off the interface between housing inner walls 26, housing base 9, semiconductor chip outer edge 29 and the pressure-sensitive area 7 of the upper side of the semiconductor chip 2. In the process, at the same time the contact areas 6, the contact terminal areas 11 and the internal sections 31 of the flat conductors and the connecting elements 14 are covered by the first plastic compound 15, leaving the pressure-sensitive area 4 free. The second plastic compound 16 is then applied to the pressure-sensitive area 4 and to parts of the first plastic compound 16.

Figure 3:
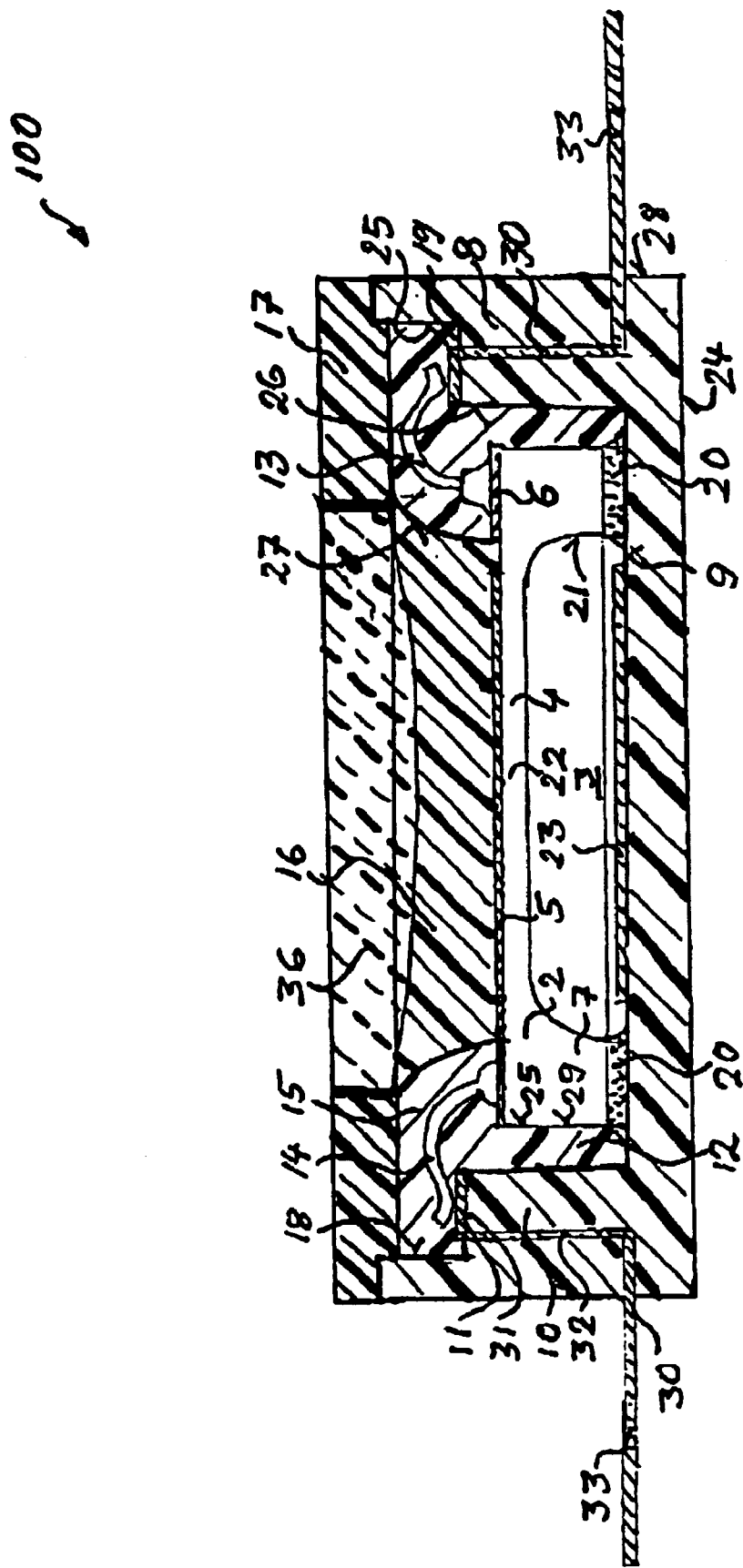
FIG. 3 shows a schematic cross section through a pressure sensor of a second embodiment of the invention.

FIG. 3 shows a schematic cross section through a pressure sensor 100 of a second embodiment of the invention. The pressure sensor 100 according to FIG. 3 differs from the pressure sensor 1 according to FIG. 1 in that the first plastic compound 15 is covered by a disk-like housing cover 17, while the second plastic compound 16 remains freely accessible via an opening 18 in the plastic housing cover 17. Two possibilities result for the fitting of the housing cover 17. In this second embodiment of the invention, the cover 17 was introduced into the soft plastic compound 15 before the application of the second plastic compound 16 and before the curing of the first plastic compound 15, so that direct adhesion occurs between housing cover 17 and first plastic compound 15. After that, the component without the second. plastic compound 16 was then first heated to 150° C. for four hours in order to cure and to crosslink the epoxy resin of the first plastic compound 15. The second plastic compound 16 was then applied to the pressure-sensitive membrane 22 through the opening 18 in the housing cover 17. During the application of the second plastic compound, the opening 18 in the housing cover 17 can also be filled with the second plastic compound 16, which is shown by the dashed hatching 36 in FIG. 3.

We claim:

1. A pressure sensor, comprising:
   a semiconductor chip having a pressure-insensitive area, a pressure-sensitive area for receiving an external pressure, and a plurality of contact areas configured on said pressure-insensitive area;
   a hollow housing having a housing interior, a housing base on which said semiconductor chip is configured, a housing wall surrounding said semiconductor chip, and a plurality of flat conductors each having an internal section projecting from said housing wall into said housing interior and an external section projecting from said housing wall away from said housing interior;
   a plurality of connecting elements, each one of said plurality of connecting elements electrically connecting one of said plurality of contact areas to said internal section of a respective one of said plurality of flat conductors;
   a first plastic compound covering said plurality of connecting elements, said internal section of each one of said plurality of plurality of flat conductors, and said plurality of contact areas; and
   a second plastic compound at least partly covering said pressure-sensitive area of said semiconductor chip;
   said first plastic compound undergoing less deformation than said second plastic compound when under a given pressure loading.

2. The pressure sensor according to claim 1, wherein said second plastic compound is a plastic gel of a resilient elastomer based on silicone.

3. The pressure sensor according to claim 1, wherein said first plastic compound includes a thermosetting plastic.

4. The pressure sensor according to claim 3, wherein said thermosetting plastic is an epoxy resin or a silicone resin.

5. The pressure sensor according to claim 1, wherein said hollow housing includes a housing cover formed with an opening exposing said pressure-sensitive area and said second plastic compound.

6. The pressure sensor according to claim 1, wherein said semiconductor chip is formed with a hermetically sealed cavity under a reference pressure.

7. The pressure sensor according to claim 6, comprising:
   a gas-tight adhesive layer;
   said semiconductor chip including a rigid semiconductor wall made of semiconductor chip material and bounding said cavity;
   said pressure-sensitive area of said semiconductor chip being formed by a pressure-sensitive membrane of semiconductor chip material;
   said cavity having a cylindrical shape and being sealed off from said pressure-sensitive membrane;
   said gas-tight adhesive layer located between said semiconductor wall and said housing base; and
   said gas-tight adhesive layer serving as a hermetic closure for said cavity.

8. The pressure sensor according to claim 1, wherein:
   said housing base has an outer underside that defines a level; and
   said external section of each one of said plurality of said flat conductors is configured at said level of said outer underside of said housing base.

9. The pressure sensor according to claim 1, wherein:
   said housing base defines a level; and
   said external section of each one of said plurality of said flat conductors is configured at said level of said housing base.

10. A vehicle tire including a pressure sensor, the pressure sensor comprising:
    a semiconductor chip having a pressure-insensitive area, a pressure-sensitive area for receiving an external pressure, and a plurality of contact areas configured on said pressure-insensitive area;
    a hollow housing having a housing interior, a housing base on which said semiconductor chip is configured, a housing wall surrounding said semiconductor chip, and a plurality of flat conductors each having an internal section projecting from said housing wall into said housing interior and an external section projecting from said housing wall away from said housing interior;
    a plurality of connecting elements, each one of said plurality of connecting elements electrically connecting one of said plurality of contact areas to said internal section of a respective one of said plurality of flat conductors;
    a first plastic compound covering said plurality of connecting elements, said internal section of each one of said plurality of plurality of flat conductors, and said plurality of contact areas; and
    a second plastic compound at least partly covering said pressure-sensitive area of said semiconductor chip;
    said first plastic compound undergoing less deformation than said second plastic compound when under a given pressure loading.

11. A motor vehicle including a pressure sensor, the pressure sensor comprising:
    a semiconductor chip having a pressure-insensitive area, a pressure-sensitive area for receiving an external pressure, and a plurality of contact areas configured on said pressure-insensitive area;
    a hollow housing having a housing interior, a housing base on which said semiconductor chip is configured, a housing wall surrounding said semiconductor chip, and a plurality of flat conductors each having an internal section projecting from said housing wall into said housing interior and an external section projecting from said housing wall away from said housing interior;

a plurality of connecting elements, each one of said plurality of connecting elements electrically connecting one of said plurality of contact areas to said internal section of a respective one of said plurality of flat conductors;

a first plastic compound covering said plurality of connecting elements, said internal section of each one of said plurality of plurality of flat conductors, and said plurality of contact areas; and a second plastic compound at least partly covering said pressure-sensitive area of said semiconductor chip;

said first plastic compound undergoing less deformation than said second plastic compound when under a given pressure loading.

12. A process for producing a pressure sensor, the process which comprises:

providing a hollow housing incorporating a semiconductor chip having a pressure-sensitive area and a plurality of pressure-insensitive areas, the hollow housing formed with an opening exposing at least the pressure-sensitive area;

applying a first plastic compound to the plurality of the pressure-insensitive areas within the hollow housing while sealing interfaces between the first plastic compound and surfaces of housing inner walls and while sealing surfaces of the pressure-insensitive areas;

applying a second plastic compound to the pressure-sensitive area of the semiconductor chip while sealing an interface between the first plastic compound and the second plastic compound in a gas-tight manner; and providing the first plastic compound with material characteristics and providing the second plastic compound with material characteristics such that the first plastic compound undergoes a lower deformation than the second plastic compound when under a common external pressure condition.

13. The process according to claim 12, which comprises first producing a plurality of semiconductor chips having pressure-sensitive areas by:

etching out cavities at a plurality of semiconductor chip positions from a rear side of a semiconductor wafer until reaching translucent and/or a pressure-sensitive membranes at the upper side of the semiconductor wafer; and after selectively applying electrodes to the pressure-sensitive membranes and applying contact areas to pressure-insensitive areas of the semiconductor wafer, dividing the semiconductor wafer into the plurality of semiconductor chips.

14. The process according to claim 13, which comprises pressure die-casting a plurality of hollow housings on a flat lead frame and embedding transition sections of flat conductors in housing walls, each of the plurality of hollow housings having a housing base.

15. The process according to claim 14, which comprises:

bonding each one of the plurality of the semiconductor chips onto the housing base of a respective one of the plurality of hollow housings;

sealing off the cavities in a gas-tight manner; and then connecting internal sections of the flat conductors to the contact areas of the semiconductor chip using bonding wires.

16. The process according to claim 12, which comprises after applying the first plastic compound and the second plastic compound, fitting a housing cover having an opening to the hollow housing, leaving the pressure-sensitive area free.

\* \* \* \* \*